United States Patent
Guo et al.

(10) Patent No.: US 11,710,624 B2
(45) Date of Patent: *Jul. 25, 2023

(54) SPUTTERING METHOD

(71) Applicant: BEIJING NAURA MICROELECTRONICS EQUIPMENT CO., LTD., Beijing (CN)

(72) Inventors: Bingliang Guo, Beijing (CN); Huaichao Ma, Beijing (CN); Andong Sun, Beijing (CN); Henan Zhang, Beijing (CN); Boyu Dong, Beijing (CN); Lu Zhang, Beijing (CN); Yujing Chen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 107 days.

This patent is subject to a terminal disclaimer.

(21) Appl. No.: 17/075,484

(22) Filed: Oct. 20, 2020

(65) Prior Publication Data

US 2021/0040605 A1    Feb. 11, 2021

Related U.S. Application Data

(63) Continuation of application No. PCT/CN2018/123821, filed on Dec. 26, 2018.

(30) Foreign Application Priority Data

Apr. 28, 2018 (CN) .......................... 201810401565.9

(51) Int. Cl.
*H01J 37/34* (2006.01)
*H01L 21/02* (2006.01)
(Continued)

(52) U.S. Cl.
CPC ...... *H01J 37/3464* (2013.01); *C23C 14/3492* (2013.01); *C23C 14/54* (2013.01);
(Continued)

(58) Field of Classification Search
CPC . C23C 14/3492; C23C 14/54; C23C 14/0617; C23C 14/541; C23C 14/048;
(Continued)

(56) References Cited

U.S. PATENT DOCUMENTS

| 5,357,389 | A | 10/1994 | Blanchette et al. |
| 9,472,384 | B2 * | 10/2016 | Yamaguchi ......... C23C 14/3407 |
| 10,640,862 | B2 * | 5/2020 | Wang ................ H01L 21/02178 |
| 10,643,843 | B2 * | 5/2020 | Wang .................. C23C 14/0617 |
| 2012/0006675 | A1 * | 1/2012 | Yamamoto .............. C23C 14/35 204/192.1 |

FOREIGN PATENT DOCUMENTS

CN  101473403 A  7/2009
CN  107488828 A  12/2017
(Continued)

*Primary Examiner* — Michael A Band
(74) *Attorney, Agent, or Firm* — Anova Law Group, PLLC

(57) ABSTRACT

A sputtering method includes one or more sputtering processes. Each sputtering process includes in a first pre-sputtering phase, sputtering a target material on a baffle plate configured to shield a substrate; in a second pre-sputtering phase, sputtering a target material compound on the baffle plate; and in a main sputtering phase, sputtering the target material compound on the substrate. The first pre-sputtering phase is used to adjust a sputtering voltage for the main sputtering phase.

9 Claims, 3 Drawing Sheets

(51) Int. Cl.
*C23C 14/54* (2006.01)
*C23C 14/06* (2006.01)
*C23C 14/34* (2006.01)

(52) U.S. Cl.
CPC .......... *C23C 14/541* (2013.01); *C23C 14/542* (2013.01); *H01J 37/3447* (2013.01); *H01J 37/3476* (2013.01); *H01J 37/3485* (2013.01); *H01J 37/3488* (2013.01); *H01L 21/02266* (2013.01); *C23C 14/0617* (2013.01)

(58) Field of Classification Search
CPC ............... H01J 37/3464; H01J 37/3488; H01J 37/3476; H01J 37/3485; H01J 37/32862; H01L 21/02266
See application file for complete search history.

(56) References Cited

FOREIGN PATENT DOCUMENTS

| | | |
|---|---|---|
| JP | H02115361 A | 4/1990 |
| JP | H04160144 A | 6/1992 |
| JP | H09227860 A | 9/1997 |
| JP | 2006083463 A | 3/2006 |
| JP | 2010084211 A | 4/2010 |
| JP | 2010229485 A | 10/2010 |
| KR | 20180010210 A | 1/2018 |
| TW | 201742937 A | 12/2017 |

\* cited by examiner

SPUTTERING METHOD

CROSS-REFERENCE TO RELATED APPLICATION

This application is a continuation of International Application No. PCT/CN2018/123821, filed on Dec. 26, 2018, which claims priority to Chinese Application No. 201810401565.9 filed on Apr. 28, 2018, the entire content of both of which is incorporated herein by reference.

TECHNICAL FIELD

The present disclosure relates to a sputtering method.

BACKGROUND

Physical vapor deposition (PVD) refers to a process of using a physical process to achieve material transfer and depositing atoms or molecules over a surface of a substrate.

A sputtering process is one of the PVD processes. In the sputtering process, particles (e.g., ions or neutral atoms and molecules) having certain energy bombard a solid surface, so that atoms or molecules of the near solid surface obtain sufficient energy and finally escape from the solid surface. The sputtering process may be used to prepare a target material, a semiconductor, an insulator, etc. Additionally, the sputtering process has advantages of using simple equipment, easy to control, large coating area, strong adhesion, etc.

In the sputtering process, while depositing a thin film on a surface of a wafer, the thin film may be inevitably deposited on the target and on the process components of the sputtering chamber. When depositing insulating materials (e.g., AlN), positive charges may be accumulated on the target, which prevent plasma from bombarding the target. That is, "target poisoning" may occur, which may affect continuity of the sputtering process. In addition, the insulating materials may be deposited on the process components, which may cause the resistance change of the process components. As a result, the sputtering voltage may change, and stability of a process result may be reduced.

SUMMARY

Embodiments of the present disclosure provide a sputtering method including one or more sputtering processes. Each sputtering process includes in a first pre-sputtering phase, sputtering a target material on a baffle plate configured to shield a substrate; in a second pre-sputtering phase, sputtering a target material compound on the baffle plate; and in a main sputtering phase, sputtering the target material compound on the substrate. The first pre-sputtering phase is used to adjust a sputtering voltage for the main sputtering phase.

DETAILED DESCRIPTION OF THE EMBODIMENTS

To illustrate the purposes, technical solutions, and advantages of the present disclosure, the present disclosure is further described in detail as follows in connection with accompanying drawings. Described embodiments represent some embodiments of the present disclosure, not all embodiments. Based on embodiments of the present disclosure, all other embodiments obtained by those of ordinary skill in the art without creative efforts are within the scope of the present disclosure.

Unless otherwise specified, technical terms or scientific terms used in the present disclosure should have meanings commonly understood by those of ordinary skill in the art of the present disclosure. The terms of "first," "second," and similar words used in the present disclosure do not indicate any order, quantity, or importance, but are only used to distinguish different components. The terms of "include" or "contain" and other similar words mean to that an element or item appearing before the word covers elements or items listed after the word and their equivalents, but do not exclude other elements or items.

Figure 1:
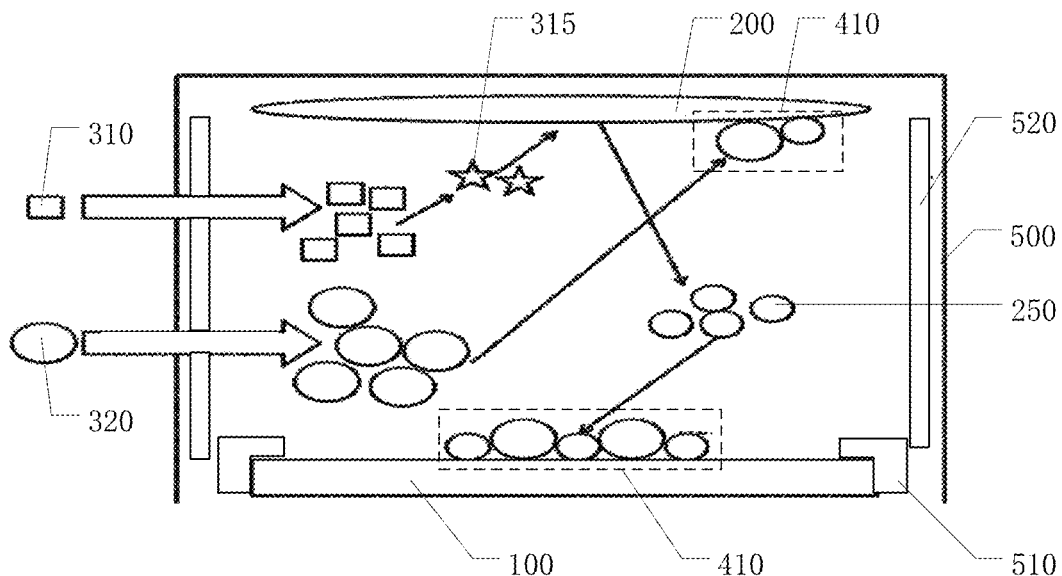
FIG. 1 is a schematic diagram for a sputtering process.

When a sputtering method is used to deposit a target material compound on a substrate, such target material compound may also be deposited on the target and on the process components including, cover-ring, a shield, etc., located in the sputtering chamber. For example, FIG. 1 shows a schematic diagram for depositing aluminum nitride (AlN) on a substrate. As shown in FIG. 1, a target 200 including aluminum is provided, and a sputtering voltage is applied to the target 200. An argon (Ar) gas 310 and nitrogen ($N_2$) gas 320 are introduced into a chamber 500. The argon gas 310 is ionized into $Ar^+$ ions 315 by an electrical field, the $Ar^+$ ions 315 bombard the target 200 under the sputtering voltage, and aluminum atoms or aluminum atom groups 250 are discharged from the target 200. The aluminum atoms or aluminum atom groups 250 move downward due to gravity to a substrate 100 and are reacted with the nitrogen gas 320 under a high temperature to form aluminum nitride (AlN) 410. In this case, the aluminum atoms or aluminum atom groups 250 and the nitrogen 320 may form the aluminum nitride (AlN) 410 on the target 200, in addition to being formed on the substrate 100. Further, the aluminum nitride (AlN) 410 may also be formed on the process components (e.g., a cover-ring 510, a shield 520, etc.) in the chamber 500.

Since the target material compound, such as the aluminum nitride, is usually an insulating material formed on the target, positive charges on the target may be difficult to transfer out. As the sputtering process continues or repeats, the positive charges of the target accumulate on the target material to form a positive electrical field, which may prevent an inert gas from continuously bombarding the target and "target poisoning" may occur. Thus, continuity of the sputtering process may be affected. In addition, after the target material compound is formed on the process components located in the chamber, the resistance of the process components may be increased and the sputtering voltage may continue to increase in the sputtering process. Under a constant power of the sputtering power source, the sputtering current becomes smaller. When the sputtering current becomes smaller, the concentration of the plasma becomes smaller, and the film-forming speed of the target material compound, such as the aluminum nitride, becomes smaller. Since the sputtering voltage and current may directly determine the film-forming speed, instability of the sputtering voltage and current may cause the thickness and quality of the thin film of the target material compound on the substrate instable. Therefore, it is desired to solve the problems of "target poisoning" and the resistance change of the process components.

To solve the problems of the "target poisoning" and the resistance change of the process components, a clearing process and a restoring process may be performed on the target and the chamber after every certain number of the sputtering processes. For example, the target material compound formed on the target may be knocked out and cleared, and a target material layer may be coated on the process components in the chamber to cover the target material compound to reduce the resistance of the process components. With the clearing process and restoring process, the sputtering voltage may be restored to an initial low level. For example, after 15 sputtering processes, the sputtering voltage may increase from 190V to 280V. After the clearing process and restoring process, the sputtering voltage may be restored to 190V. Then, another 15 sputtering processes may be performed, and the sputtering voltage may increase to 280V again, and so on. However, a fluctuating range of the sputtering voltage of this method is large (e.g., from 190V to 280V), which cannot control the sputtering voltage in a stable range. Therefore, the thickness and quality of the thin film of the target material compound on the substrate are unstable. In addition, since the clearing process and restoring process need to be performed on the target and the chamber after every certain number of the sputtering processes, the continuous production may not be provided. Thus, production efficiency and capacity may be reduced, and a utilization rate of the target may be affected.

Figure 2:
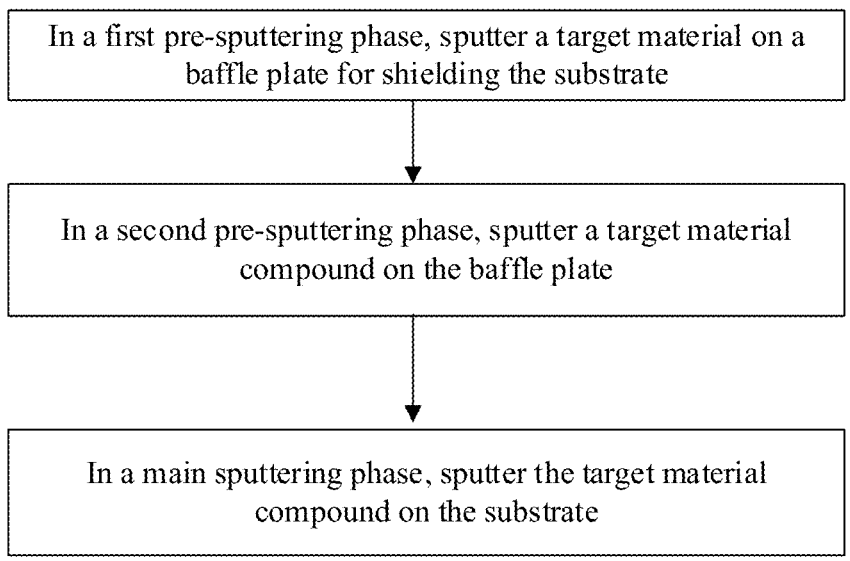
FIG. 2 illustrates an exemplary sputtering method according to some embodiments of the present disclosure.

Embodiments of the present disclosure provide a sputtering method. An exemplary sputtering method includes at least one sputtering process. As shown in FIG. 2, the sputtering process includes: in a first pre-sputtering phase, sputtering a target material on a baffle plate for shielding the substrate; in a second pre-sputtering phase, sputtering a target material compound on the baffle plate; and in a main sputtering phase, sputtering the target material compound on the substrate. The first pre-sputtering process is used to adjust a sputtering voltage for the main sputtering process. The sputtering voltage of the main sputtering process may be an average value of the sputtering voltages.

In the first pre-sputtering phase and the second pre-sputtering phase, after the substrate is introduced into the sputtering chamber, the baffle plate may be placed between the target material and the substrate to shield the substrate.

In the main sputtering phase, the baffle plate may be moved away from between the target and the substrate to allow the target material compound to be deposited on the substrate.

In the first pre-sputtering phase, on one aspect, the target may be cleared, and the target material may be deposited on the process components (e.g., the cover-ring and the shield) in the sputtering chamber. Problems of the "target poisoning" and the resistance change of the process components may thus be avoided. On another aspect, in the first pre-sputtering phase, the amount of the sputtering voltage may be controlled to reduce the fluctuating range of the sputtering voltage for the main sputtering phase, such that the stability of the thickness and quality of the thin film may be improved. In addition, with the sputtering method, the production efficiency and capacity may be greatly improved, and the utilization rate of the target may be improved.

In the second pre-sputtering phase, an unstable plasma at start may be sputtered on the baffle plate to thus avoid unstable target material compound to be deposited on the substrate. As such, the film-forming quality of the target material compound deposited on the substrate may be improved.

In the first pre-sputtering phase, the particles (ions or neutral atoms and molecules) with certain energy may be used to bombard the surface of the target to cause the atoms of the surface of the target to obtain enough energy to eventually escape from the surface of the target. For example, the particles may be argon ions. In some embodiments, argon gas may be introduced to the sputtering chamber, and excited to be ionized to form the argon ions.

In the sputtering method according to embodiments of the present disclosure, the first pre-sputtering phase may be performed during each sputtering process. In other words, for each sputtering process, the problem of the "target poisoning" may be cleared and the resistance of the process components may be reduced. Thus, the sputtering voltage of the main sputtering phase may not fluctuate much, and the sputtering voltage is stable. As such, the stability of the thickness and quality of the thin film of the target material compound deposited on the substrate may be improved. In addition, the clearing process and restoring process for the target and the chamber after every certain number of the sputtering processes are not needed for the sputtering method, and the production efficiency and capacity may be greatly improved. Further, since the clearing process and the restoring process of the target and the chamber may consume a large amount of the target, the clearing process and the restoring process may be removed from the sputtering method, and the utilization rate of the target may be also improved.

For example, for the same time length (e.g., 4 hours), in a conventional sputtering method, after 15 sputtering processes (e.g., for 3 hours) are performed, the clearing process and the restoring process need to be performed on the target and the chamber (e.g., for 1 hour). However, in the disclosed sputtering method according to embodiments of the present disclosure, the production may be continuously performed (e.g., for 4 hours). Therefore, the normal production time length of the sputtering method according to embodiments of the present disclosure in a unit time is 1.33 times the normal production time length of the conventional sputtering method. That is, the production capacity is improved by 33%. In contrast to the conventional sputtering method where the clearing process and the restoring process consume a large amount of energy (e.g., electricity) and material (e.g., target), the sputtering method provided by embodiments of the present disclosure may further reduce production cost.

In some embodiments, the sputtering process may include a parameter adjusting process. The parameter adjusting process may include adjusting process parameters in the first pre-sputtering phase to adjust the sputtering voltage for the main sputtering phase subsequently performed.

By adjusting the process parameters in the first pre-sputtering phase, on one aspect, a degree of clearing the target material compound formed on the surface of the target may be adjusted. On another aspect, the amount of the target material formed on the baffle plate and the process components (e.g., the cover-ring and the shield) may be changed, and the resistance of the process components may be adjusted. Eventually, the sputtering voltage for the main sputtering phase may be adjusted.

In some embodiments, the process parameters may further include processing time. For example, when the sputtering voltage in the main sputtering phase is relatively high, the processing time may be increased to reduce the sputtering voltage for the main sputtering phase in a next sputtering process. On the contrary, when the sputtering voltage in the main sputtering phase is relatively low, the processing time may be reduced to increase the sputtering voltage for the main sputtering phase in the next sputtering process.

In some embodiments, the target material compound may include oxide of the target material or nitride of the target material.

For example, the target material may include aluminum, in this case, the target material compound may include aluminum nitride or aluminum oxide. The aluminum nitride (AlN) thin film may be broadly applied in fields of light-emitting diode (LED), high electron mobility transistor (HEMT), micro-electro-mechanical system (MEMS), etc. With the sputtering method of embodiments of the present disclosure, the aluminum nitride may be deposited on the substrate, and the parameters of the stability of the film-forming quality and thickness of the aluminum nitride may be improved. As such, the performance of an electronic device containing the aluminum nitride film layer may be improved. The target material may include other metals, such as gallium, iron, copper, cobalt, zinc, etc., without any limitations according to various embodiments of the present disclosure.

In some embodiments, the substrate may include a silicon substrate, a silicon carbide substrate, or a sapphire substrate, etc.

In some embodiments, in the first pre-sputtering phase, the inert gas may be introduced to the sputtering chamber. The inert gas may be ionized and bombard the target under the electrical field. Since the inert gas may have a stable chemical property and may not react with the target material, the sputtered target material may be deposited on the baffle plate and the process components in the chamber.

For example, the inert gas may include argon gas, although any other suitable inert gases may be used and encompassed according to various embodiments of the present disclosure.

In some embodiments, in the second pre-sputtering phase, the inert gas used to bombard the target and the reaction gas used to react with the target material to form the target material compound may be introduced into the sputtering chamber. In some embodiments, the inert gas may be ionized under the action of the electrical field and bombard the target under the action of the sputtering voltage, such that the target may discharge the atoms or atom groups of the target material. The atoms or atom groups of the target material may move downward due to the gravity to the substrate and react with the reaction gas to form the target material compound at a high temperature. For example, the inert gas may include the argon gas, and the reaction gas, reactive with the target material to form the target material compound, may include nitrogen or oxygen. Therefore, the reaction gas may react with the target material to form the nitride or oxide of the target material.

For example, when the sputtering method of embodiments of the present disclosure is used to deposit the aluminum nitride on the substrate, in the first pre-sputtering phase, the argon gas with a volume flow range of 180 to 200 sccm may be introduced to the chamber. In the second pre-sputtering phase, the argon gas with a volume flow range of 30 to 60 sccm and the nitrogen with a volume flow range of 150 to 200 sccm may be introduced into the chamber.

In some embodiments, the sputtering method may further include heating the substrate. By heating the substrate, the target material compound may be easily deposited and crystalized on the substrate. After the substrate is heated, the target material compound may be easier to be deposited and crystallized on the substrate and have better quality.

On another aspect, in embodiments of the present disclosure, the substrate heating process and the sputtering process may be performed in the same chamber. Therefore, no additional heating chamber needs to be provided, and the volume of the equipment and the production cost may be reduced. In addition, since the substrate does not need to be transferred between different chambers, the problem of particles, which are generated when transferring the substrate, falling on the substrate may be avoided.

In some embodiments, in the sputtering method, the sputtering process may be continuously performed more than twice. Embodiments of the present disclosure are not limited to this, and in the sputtering method, the conventional sputtering process may be inserted into a plurality of the disclosed sputtering processes.

In some embodiments, in the sputtering method, the sputtering process may be performed more than twice, and after every N times of the sputtering processes, the parameter adjusting process may be performed, where N may be an integer greater than or equal to 1. In other words, after each sputtering process is performed, the parameter adjusting process may be performed.

Implementations of the parameter adjusting process may be described in detail below. In some embodiments, in a first exemplary implementation, the parameter adjusting process includes the following exemplary processes 101 and 102.

At 101, the sputtering voltages of the main sputtering phase are detected and recorded during the N times of the sputtering processes.

In the process 101, during the N sputtering processes, the sputtering voltages of the main sputtering phases may be updated. In some embodiments, the sputtering voltage of the main sputtering phase in an (i+1)-th sputtering process may cover (or replace) the sputtering voltage of the main sputtering phase in an i-th sputtering process. The average sputtering voltage of the main sputtering phases in the N sputtering processes may replace the sputtering voltage of the main sputtering phase in an N-th sputtering process, where I=1, 2, . . . , N.

At 102, it is determined whether the sputtering voltage of the main sputtering phase in the N-th sputtering process exceeds a reference voltage range.

If the sputtering voltage of the main sputtering phase in the N-th sputtering phase exceeds an upper limit of the reference voltage range, the processing time of the first pre-sputtering phase may be increased for the (N+1)-th sputtering process. As such, the target material compound formed on the surface of the target may be more thoroughly cleared, and more target material may be formed on the process components in the chamber. Therefore, a better effect may be achieved. Meanwhile, by increasing the processing time of the first pre-sputtering process in the (N+1)-th sputtering process, the sputtering voltage of the main sputtering phase may be reduced in the (N+1)-th sputtering process to cause the sputtering voltage to be in the reference voltage range. On the contrary, if the sputtering voltage of the main sputtering phase in the N-th sputtering process exceeds the lower limit of the reference voltage range, the processing time of the first sputtering phase may be reduced in the (N+1)-th sputtering process.

As such, with the sputtering method, the sputtering voltage may be accurately controlled by the above implementation to be within the reference voltage range. Therefore, the film-forming speed of the sputtering method may be further stabilized, and the thin film quality of the target material compound formed by the disclosed sputtering method may be improved.

In practical applications, the reference voltage range may be reference voltages ±a V. The reference voltages may be the sputtering voltages for the best film forming quality, and "a" is greater than or equal to 1.

In a second exemplary implementation, the parameter adjusting process may include the following exemplary processes 201, 202, and 203.

At 201, the sputtering voltages of the main sputtering phases are detected and recorded from the (N−M)-th sputtering process to N-th sputtering process (e.g., latest detected, counting M sputtering processes from the N-th sputtering process toward former processes, including, for example, the N-th sputtering process, the (N−1)-th sputtering process, . . . , till the (N−M)-th sputtering process). N is an integer larger than or equal to 2. M is an integer larger than or equal to 1, and M<N.

In the process 201, in the M sputtering processes, the sputtering voltages of the main sputtering phases may be updated. In some embodiments, the sputtering voltage of the main sputtering phase of the (i+1)-th sputtering process may cover (i.e., replace) the sputtering voltage of the main sputtering phase of the i-th sputtering process. The average sputtering voltage of the main sputtering phases of the M sputtering processes may cover (i.e., replace) the sputtering voltage of the main sputtering phase of the N-th sputtering process, and i=1, 2, . . . , M.

At 202, the sputtering voltage of the main sputtering phase of the N-th sputtering process is compared with a first set voltage and a second set voltage. The first set voltage is larger than the second set voltage.

If the sputtering voltage of the main sputtering phase of the N-th sputtering process is larger than the first set voltage, the processing time of the first pre-sputtering phase in the (N+1)-th sputtering process is increased by a first pre-set time length.

If the sputtering voltage of the main sputtering phase in the N-th sputtering process is smaller than the second set voltage, the processing time of the first pre-sputtering phase in the (N+1)-th sputtering process is reduced by the first preset time length.

By detecting and recording the sputtering voltages of the main sputtering phases in the latest detected M sputtering processes, the processing time of the first pre-sputtering phase may be dynamically adjusted to cause the sputtering voltage of the main sputtering phase to be closer to an ideal value.

In addition, by setting the first set voltage and the second set voltage to control the sputtering voltage, the sputtering voltage may be stabilized in an appropriate range. As such, the film-forming speed of the sputtering method may be further stabilized, and the thin film quality of the target material compound formed by the sputtering method may be improved. The first set voltage and the second set voltage may be set according to the sputtering voltage of the best film forming quality. For example, when the sputtering voltage of the best film forming quality of the sputtering equipment using the sputtering method is 190V, the first set voltage may be set to 190V+mV, and the second set voltage may be set to 190V−mV, and m may be set according to the actual needs.

In some embodiments, M<N, and M may be larger than or equal to 5, for example, M=10.

In practical applications, a storage device may be configured to store the sputtering voltages of the main sputtering phases in the M sputtering processes. Embodiments of the present disclosure are not limited to this, and other storage devices may be configured to record the sputtering voltages of the main sputtering phases in the M sputtering processes. Further, a processor may be configured to compare the sputtering voltage of the main sputtering phase in the N-th sputtering process with the first set voltage and the second set voltage. Embodiments of the present disclosure are not limited to this, and other computing or comparing devices may be configured to compare the sputtering voltage of the main sputtering phase in the N-th sputtering process to the first set voltage and the second set voltage.

In some embodiments, the parameter adjusting process may further include the following processes.

If the sputtering voltage of the main sputtering phase in the N-th sputtering process is smaller than the first set voltage and larger than the second set voltage, the process 203 is performed.

At 203, it is determined whether a changing trend of the sputtering voltages of the main sputtering phases from the (N−M)-th sputtering process to the N-th sputtering process is increasing or decreasing.

If the changing trend is increasing, the processing time of the first pre-sputtering phase in the (N+1)-th sputtering process is increased by a second pre-set time length.

If the changing trend is decreasing, the processing time of the first pre-sputtering phase in the (N+1)-th sputtering process is reduced by the second preset time length.

The second preset time length is shorter than the first preset time length.

When the sputtering voltage of the main sputtering phase in the N-th sputtering process is smaller than the first set voltage and larger than the second set voltage, the sputtering voltage may further be adjusted according to the sputtering method of embodiments of the present disclosure.

Further, since the second preset time length is shorter than the first preset time length, the sputtering voltage of the main sputtering phase may be adjusted precisely to further reduce the fluctuation range of the sputtering voltage. As such, the film-forming quality may be improved by the disclosed sputtering method. For example, if an initial processing time of the first pre-sputtering phase in the sputtering process is 5 seconds, the first preset time length may be set to 1 second, and the second set time may be set to 0.5 second.

In some embodiments, in the process 203, it is determined whether the sputtering voltage of the main sputtering phase in the N-th sputtering process is larger than the sputtering voltage of the main sputtering phase in the (N−1)-th sputtering process.

If the sputtering voltage of the main sputtering phase in the N-th sputtering process is larger, the changing trend of the sputtering voltage of the main sputtering phase from the (N−M)-th sputtering process to the N-th sputtering process is increasing.

If the sputtering voltage of the main sputtering phase in the N-th sputtering process is smaller, the changing trend of the sputtering voltage of the main sputtering phase from the (N−M)-th sputtering process to the N-th sputtering process is decreasing.

In some embodiments, the sputtering method may further include the following exemplary processes 301 and 302.

At 301, the sputtering voltage of the main sputtering phase of each sputtering process is detected.

At 302, the sputtering voltage of the main sputtering phase of each sputtering process is compared with a first alarm voltage and a second alarm voltage. The first alarm voltage is larger than the second alarm voltage.

If the sputtering voltage of the main sputtering phase of each sputtering process is smaller than the first alarm voltage and larger than the second alarm voltage, a next sputtering process is performed.

If the sputtering voltage of the main sputtering phase of each sputtering process is larger than the first alarm voltage or smaller than the second alarm voltage, the current sputtering process is stopped.

By comparing the sputtering voltage of the main sputtering phase with the first alarm voltage and the second alarm voltage, the user may choose to continue with or stop the sputtering process according to a comparison result. As such, the safety and stability of the sputtering method may be improved.

The first alarm voltage and the second alarm voltage may be an upper limit and a lower limit of the alarm voltage, respectively, and are used to prevent the sputtering voltage of the sputtering method from exceeding alarm values. As such the safety and stability of the sputtering method may be improved. The first alarm voltage and the second alarm voltage may be set according to different sputtering equipment and actual needs.

In practical applications, after the current sputtering process is stopped, the sputtering equipment may be repaired and maintained.

In embodiments of the present disclosure, the sputtering method may further include the following exemplary processes 401 and 402.

At 401, the processing time of the first pre-sputtering phase of each sputtering process is detected.

At 402, the processing time of the first pre-sputtering phase is compared with the first alarm time and the second alarm time. The first alarm time is longer than the second alarm time.

If the processing time of the first pre-sputtering phase is smaller than the first alarm time and larger than the second alarm time in each of the sputtering processes, the next sputtering process is performed.

If the processing time of the first pre-sputtering phase is larger the first alarm time or smaller than the second alarm time in each of the sputtering processes, the current sputtering process is stopped.

Since the processing time of the first pre-sputtering phase is adjustable, whether the equipment executing the sputtering method of embodiments of the present disclosure is normal may be determined according to the processing time of the first pre-sputtering phase. The first alarm time and the second alarm time may be an upper limit and a lower limit of the alarm time, respectively, which may be used to prevent the processing time of the sputtering method from exceeding the alarm limits. As such, the safety and the stability of the sputtering method may be further ensured.

Figure 3:
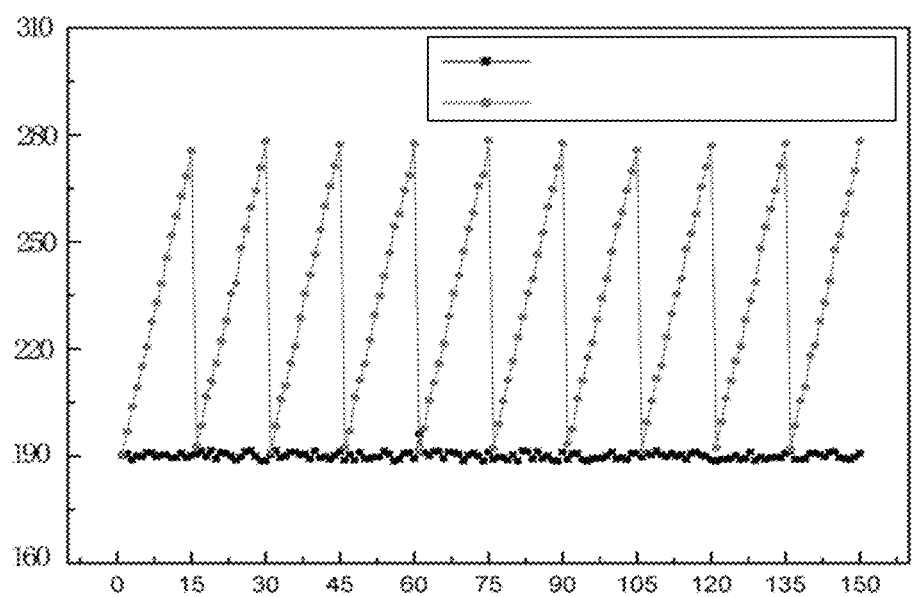
FIG. 3 illustrates comparison in sputtering voltages of an exemplary sputtering method over a conventional sputtering method according to some embodiments of the present disclosure.

FIG. 3 illustrates comparison in sputtering voltages of an exemplary sputtering method over a conventional sputtering method according to some embodiments of the present disclosure. As shown in FIG. 3, the sputtering voltage of the conventional sputtering method fluctuates between 190V and 280V. A difference between the highest sputtering voltage and the lowest sputtering voltage is 90V. With the sputtering voltage of embodiments of the present disclosure, the sputtering voltage of the main sputtering phase may be controlled within the range of 190±1V. The film-forming speed of the conventional method fluctuates between 0.3 and 0.19 nm/s. The film-forming speed of the sputtering method of embodiments of the present disclosure is controlled at 0.3 nm/s, which greatly improves the stability of the film-forming speed.

Figure 4:
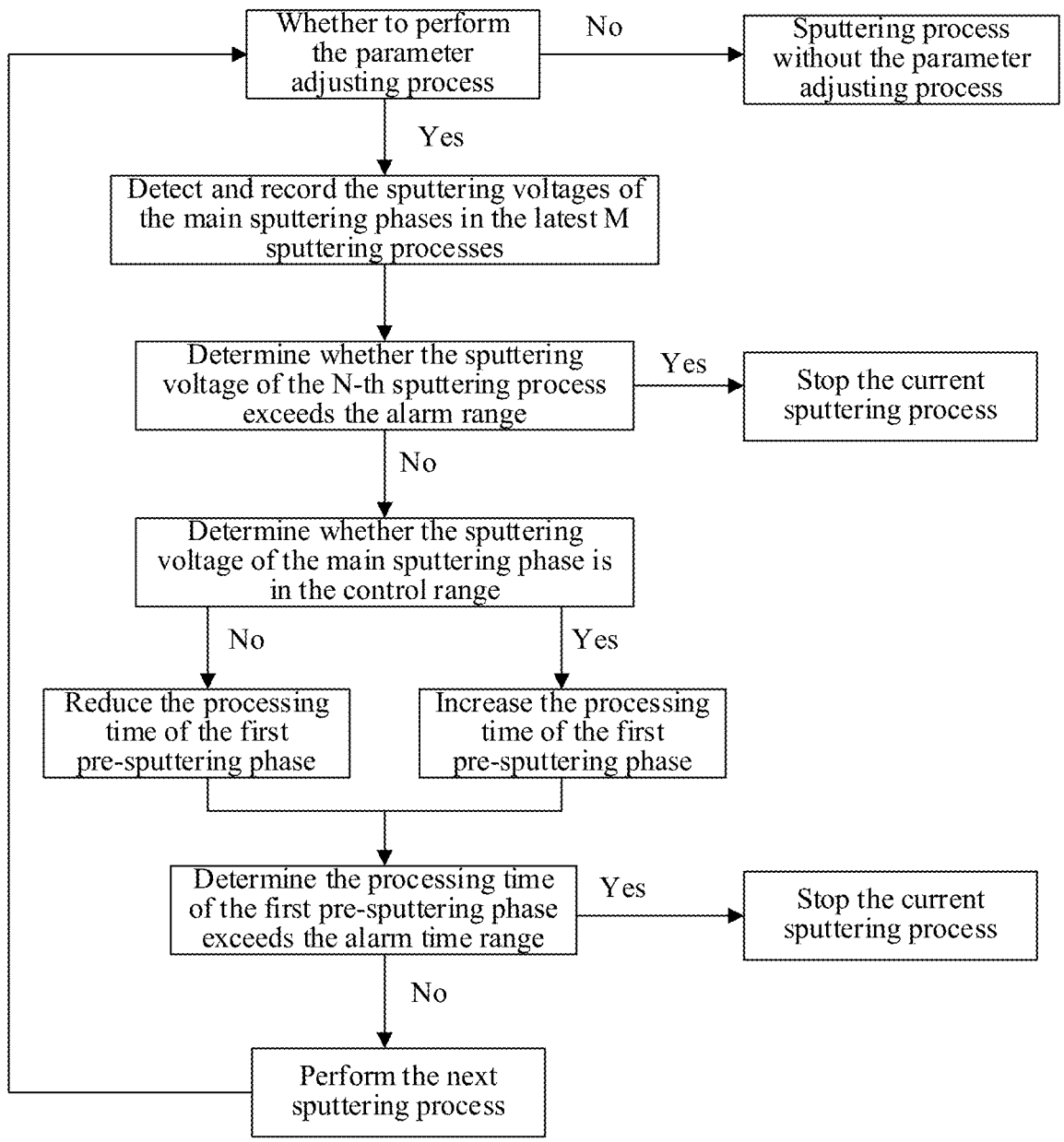
FIG. 4 illustrates another exemplary sputtering method according to some embodiments of the present disclosure.

FIG. 4 illustrates another exemplary sputtering method according to some embodiments of the present disclosure. As shown in FIG. 4, the sputtering method includes processes of determining whether to perform the parameter adjusting process. If the parameter adjusting process is chosen, an implementation of one of the above exemplary parameters adjusting processes is chosen for execution. For example, the second implementation is chosen in FIG. 4 and includes detecting and recording the sputtering voltages of the main sputtering phase from the (N−M)-th sputtering process to the N-th sputtering process. N is the integer larger than or equal to 2. M is the integer larger than or equal to 1, and M<N.

If the parameter adjusting process is not performed, the sputtering method is executed according to the sputtering process without the parameter adjusting process, that is, a manner without a controlled voltage is used for production.

Then, whether the sputtering voltage of the main sputtering phase exceeds the alarm range (including the first alarm voltage (upper limit) and the second alarm voltage (lower limit)) in the N-th sputtering process may be determined. If the sputtering voltage of the main sputtering phase exceeds the alarm range, the current sputtering process is stopped. If the sputtering voltage of the main sputtering phase exceeds the alarm range does not exceed the alarm range, subsequent processes are performed. In practical applications, the sputtering voltage of the main sputtering phase may be determined in each sputtering process.

Then, whether the sputtering voltage of the main sputtering phase is in the control range may be determined. The control range may be the reference voltage, and the sputtering voltage and the reference voltage may be determined to determine whether the sputtering voltage of the main sputtering phase is in the reference voltage range. The control range may also be the range formed by the first set voltage and the second set voltage. In this case, the relationship between the sputtering voltage with the first set voltage and the second set voltage may be determined. If the sputtering voltage is in the control range determined by the first and second set voltages, the processing time of the first pre-sputtering phase may be reduced. If the sputtering voltage is not in the control range determined by the first and second set voltages, the processing time of the first pre-sputtering phase may be increased.

Finally, whether the processing time of the first pre-sputtering phase exceeds the alarm time range (including the first alarm time and the second alarm time) may be determined. If the processing time of the first pre-sputtering phase does not exceed the alarm time range, the sputtering process is performed, and if the processing time of the first pre-sputtering phase exceeds the alarm time range, the current sputtering process is stopped.

For example, when the sputtering method of embodiments of the present disclosure is used to form the aluminum nitride thin film used for an LED, the use of aluminum nitride may improve the performance of the LED. Table 1 compares the performance of the LED prepared by using the conventional sputtering method with the performance of the LED prepared by the disclosed sputtering method according to embodiments of the present disclosure. As shown in Table 1, the fluctuation ranges of extension brightness and wavelength standard deviation of the LED prepared by the disclosed sputtering method becomes smaller, and the performance is more stable. In addition, chip brightness, antistatic discharge capability, and stability of reverse leakage are greatly improved. The performance of the LED prepared by the disclosed sputtering method is greatly improved. In Table 1, the LED prepared by the conventional sputtering method includes aluminum nitride thin film in the LED prepared by the conventional sputtering method. In Table 1, the LED prepared by the disclosed sputtering method includes aluminum nitride thin film in the LED prepared by the disclosed sputtering method. The present disclosure is not limited to this, and the sputtering method of embodiments of the present disclosure may be further used to prepare other film layers used to prepare the LED.

TABLE 1

| Item | Fluctuation Range of Extension Result (Based on Reference Line) | | Fluctuation Range of Chip Result (Based on Reference Line) | | |
|---|---|---|---|---|---|
| | Extension Brightness | Wavelength Standard Deviation | Chip Brightness | Anti-static Discharge Ability | Reverse Leakage |
| Conventional Sputtering Method | ±10.0% | ±0.8% | ±1.0% | ±2.2% | ±4.5% |
| Disclosed Exemplary Sputtering Method | ±2.5% | ±0.3% | ±0.2% | ±1.0% | ±1.2% |

It should be noted that the drawings in the present disclosure are described relating to structures according to exemplary embodiments of the present disclosure, and other related structures with normal design may be added and encompassed within the scope of the present disclosure. Non-conflict features in a same embodiment and/or different embodiments may be combined with each other, which may be encompassed within the scope of the present disclosure.

The above description describes merely exemplary embodiments of the present disclosure and is not used to limit the scope of the present disclosure. The scope of the invention should be determined by the appended claims.

What is claimed is:

1. A sputtering method, comprising:
one or more sputtering processes, each sputtering process including:
in a first pre-sputtering phase, sputtering a target material on a baffle plate configured to shield a substrate;
in a second pre-sputtering phase, sputtering a target material compound on the baffle plate;
in a main sputtering phase, sputtering the target material compound on the substrate,
wherein the first pre-sputtering phase is used to adjust a sputtering voltage for the main sputtering phase by a parameter adjusting process, the parameter adjusting process including: adjusting a process parameter of the first pre-sputtering phase to adjust the sputtering voltage of the main sputtering phase, the process parameter including processing time,
wherein the one or more sputtering processes are performed more than twice; and the parameter adjusting process is performed after every N sputtering processes, N being an integer greater than or equal to 1,
wherein the parameter adjusting process further includes:
detecting and recording sputtering voltages of main sputtering phases in the N sputtering processes; and
determining whether a sputtering voltage of a main sputtering phase in an N-th sputtering process exceeds a reference voltage range:

in response to the sputtering voltage of the main sputtering phase in the N-th sputtering process exceeding an upper limit of the reference voltage range, increasing a processing time of a first pre-sputtering phase in an (N+1)-th sputtering process; and
in response to the sputtering voltage of the main sputtering phase in the N-th sputtering process exceeding a lower limit of the reference voltage range, reducing the processing time of the first pre-sputtering phase in the (N+1)-th sputtering process to cause a sputtering voltage of a main sputtering phase in the (N+1)-th sputtering process to be in the reference voltage range.

2. A sputtering method, comprising:
one or more sputtering processes, each sputtering process including:
in a first pre-sputtering phase, sputtering a target material on a baffle plate configured to shield a substrate;
in a second pre-sputtering phase, sputtering a target material compound on the baffle plate;
in a main sputtering phase, sputtering the target material compound on the substrate,
wherein the first pre-sputtering phase is used to adjust a sputtering voltage for the main sputtering phase by a parameter adjusting process, the parameter adjusting process including: adjusting a process parameter of the first pre-sputtering phase to adjust the sputtering voltage of the main sputtering phase, the process parameter including processing time,
wherein the one or more sputtering processes are performed more than twice; and the parameter adjusting process is performed after every N sputtering processes, N being an integer greater than or equal to 1,
wherein the parameter adjusting process further includes:
detecting and recording sputtering voltages of main sputtering phases from an (N–M)-th sputtering process to an N-th sputtering process, N being the integer greater than or equal to 2, M being an integer greater than or equal to 1, and M<N; and
comparing a sputtering voltage of a main sputtering phase of the N-th sputtering process with a first set voltage and a second set voltage, the first set voltage being larger than the second set voltage:
in response to the sputtering voltage of the main sputtering phase in the N-th sputtering process being larger than the first set voltage, increasing processing time of a first pre-sputtering phase in an (N+1)-th sputtering process by a first pre-set time length; and
in response to the sputtering voltage of the main sputtering phase in the N-th sputtering process being smaller than the second determined voltage, reducing the processing time of the first pre-sputtering phase in the (N+1)-th sputtering process by the first pre-set time length.

3. The method of claim 2, further comprising:
in response to the sputtering voltage of the main sputtering phase in the N-th sputtering process being smaller than the first set voltage and larger than the second set voltage, determining whether a changing trend of the sputtering voltages of the main sputtering phases from the (N−M)-th sputtering process to the N-th sputtering process is increasing or decreasing:
in response to the changing trend being increasing, increasing the processing time of the first pre-sputtering phase in the (N+1)-th sputtering process by a second pre-set time length; and
in response to the changing trend being decreasing, reducing the processing time of the first pre-sputtering phase in the (N+1)-th sputtering process by the second pre-set preset time, the second pre-set preset time being shorter than the first pre-set time length.

4. The method of claim 3, when determining whether the changing trend of the sputtering voltages of the main sputtering phases from the (N−M)-th sputtering process to the N-th sputtering process is increasing or decreasing, further comprising:
determining whether the sputtering voltage of the main sputtering phase in the N-th sputtering process is larger than a sputtering voltage of a main sputtering phase in an (N−1)-th sputtering process:
in response to the sputtering voltage of the main sputtering phase in the N-th sputtering process being larger than the sputtering voltage of the main sputtering phase in the (N−1)-th sputtering process, determining that the changing trend of the sputtering voltage of the main sputtering phase from the (N−M)-th sputtering process to the N-th sputtering process is increasing; and
in response to the sputtering voltage of the main sputtering phase in the N-th sputtering process being smaller than the sputtering voltage of the main sputtering phase in the (N−1)-th sputtering process, determining that the changing trend of the sputtering voltage of the main sputtering phase from the (N−M)-th sputtering process to the N-th sputtering process is decreasing.

5. The method of claim 1, further comprising:
detecting the sputtering voltage of the main sputtering phase in each sputtering process; and
comparing the sputtering voltage of the main sputtering phase with a first alarm voltage and a second alarm voltage in each sputtering process, the first alarm voltage being larger than the second alarm voltage:
in response to the sputtering voltage of the main sputtering phase being smaller than the first alarm voltage and larger than the second alarm voltage in each sputtering process, performing a next sputtering process; and
in response to the sputtering voltage of the main sputtering phase being larger than the first alarm voltage or smaller than the second alarm voltage in each sputtering process, stopping a current sputtering process.

6. The method of claim 2, further comprising:
detecting the sputtering voltage of the main sputtering phase in each sputtering process; and
comparing the sputtering voltage of the main sputtering phase with a first alarm voltage and a second alarm voltage in each sputtering process, the first alarm voltage being larger than the second alarm voltage:
in response to the sputtering voltage of the main sputtering phase being smaller than the first alarm voltage and larger than the second alarm voltage in each sputtering process, performing a next sputtering process; and
in response to the sputtering voltage of the main sputtering phase being larger than the first alarm voltage or smaller than the second alarm voltage in each sputtering process, stopping a current sputtering process.

7. The method of claim 1, further comprising:
detecting a processing time of the first pre-sputtering phase in each sputtering process; and
comparing the processing time of the first pre-sputtering phase with a first alarm time and a second alarm time in each sputtering process, the first alarm time being longer than the second alarm time:
in response to the processing time of the first pre-sputtering phase being shorter than the first alarm time and longer than the second alarm time in each sputtering process, performing a next sputtering process; and
in response to the processing time of the first pre-sputtering phase being longer than the first alarm time or shorter than the second alarm time in each sputtering process, stopping a current sputtering process.

8. The method of claim 2, further comprising:
detecting a processing time of the first pre-sputtering phase in each sputtering process; and
comparing the processing time of the first pre-sputtering phase with a first alarm time and a second alarm time in each sputtering process, the first alarm time being longer than the second alarm time:
in response to the processing time of the first pre-sputtering phase being shorter than the first alarm time and longer than the second alarm time in each sputtering process, performing a next sputtering process; and
in response to the processing time of the first pre-sputtering phase being longer than the first alarm time or shorter than the second alarm time in each sputtering process, stopping a current sputtering process.

9. The method of claim 7, wherein the target material includes aluminum, gallium, iron, copper, cobalt, zinc, or a combination thereof.

* * * * *